US012580546B2

(12) United States Patent
Teramoto

(10) Patent No.: US 12,580,546 B2
(45) Date of Patent: Mar. 17, 2026

(54) FILTER APPARATUS AND RADIO-FREQUENCY FRONT END CIRCUIT INCORPORATING THE SAME

(71) Applicant: Murata Manufacturing Co., Ltd., Nagaokakyo (JP)

(72) Inventor: Masahiro Teramoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 190 days.

(21) Appl. No.: 18/527,442

(22) Filed: Dec. 4, 2023

(65) Prior Publication Data

US 2024/0097638 A1 Mar. 21, 2024

Related U.S. Application Data

(63) Continuation of application No. PCT/JP2022/020811, filed on May 19, 2022.

(30) Foreign Application Priority Data

Jun. 25, 2021 (JP) ................................ 2021-105871

(51) Int. Cl.
*H03H 7/46* (2006.01)
*H03H 7/075* (2006.01)
(52) U.S. Cl.
CPC ............ *H03H 7/463* (2013.01); *H03H 7/075* (2013.01)

(58) Field of Classification Search
CPC ............................... H03H 7/075; H03H 7/463
USPC ......................................................... 333/132
See application file for complete search history.

(56) References Cited

U.S. PATENT DOCUMENTS 6,411,178 B1 6/2002 Matsumura et al.
2022/0131516 A1 4/2022 Yamazaki et al.

FOREIGN PATENT DOCUMENTS

JP 2001-136045 A 5/2001
JP 2001-144566 A 5/2001
WO 2021/029154 A1 2/2021

OTHER PUBLICATIONS

Official Communication issued in International Patent Application No. PCT/JP2022/020811, mailed on Aug. 2, 2022.

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

A filter apparatus includes an input terminal, first and second ground electrodes opposed to each other, and first and second filters connected to the input terminal. The first filter has a first passband. The second filter has a second passband higher than the first passband. Each of the first and second filters includes resonators in stages between the first and second ground electrodes. A resonator in the first stage in the first filter includes a capacitor connected to the second ground electrode and an inductor connected between the capacitor and the first ground electrode. A resonator in the first stage in the second filter includes a capacitor connected between the input terminal and the second ground electrode and an inductor connected between the capacitor and the second ground electrode.

17 Claims, 13 Drawing Sheets

FILTER APPARATUS AND RADIO-FREQUENCY FRONT END CIRCUIT INCORPORATING THE SAME

CROSS REFERENCE TO RELATED APPLICATIONS

This application claims the benefit of priority to Japanese Patent Application No. 2021-105871 filed on Jun. 25, 2021 and is a Continuation Application of PCT Application No. PCT/JP2022/020811 filed on May 19, 2022. The entire contents of each application are hereby incorporated herein by reference.

BACKGROUND OF THE INVENTION

1. Field of the Invention

The present disclosure relates to a filter apparatus and a radio-frequency front end circuit including the same, and more particularly, to techniques to improve attenuation characteristics in a diplexer.

2. Description of the Related Art

WO2021/029154 discloses a diplexer including a high-band filter and a low-band filter. In the diplexer described in WO2021/029154, each of the high-band filter and the low-band filter is composed of LC resonance circuits in a plurality of stages.

Each filter in such a diplexer is generally desired to have small insertion loss in a passband and large attenuation characteristics in a non-passband. In particular, when the passbands of the two filters are proximate to each other, attenuation characteristics have a large amount of attenuation in the non-passband are required.

SUMMARY OF THE INVENTION

Preferred embodiments of the present invention improve attenuation characteristics in a non-passband in filter apparatuses each including a plurality of filters.

A filter apparatus according to a preferred embodiment of the present invention includes an input terminal, a first ground electrode and a second ground electrode opposed to each other, and a first filter and a second filter connected to the input terminal. The first filter has a first passband. The second filter has a second passband higher than the first passband. Each of the first filter and the second filter includes resonators in a plurality of stages between the first ground electrode and the second ground electrode. A resonator in a first stage connected to the input terminal in the first filter includes a first capacitor connected to the second ground electrode, and a first inductor connected between the first capacitor and the first ground electrode. A resonator in a first stage connected to the input terminal in the second filter includes a second capacitor connected between the input terminal and the second ground electrode, and a second inductor connected between the second capacitor and the second ground electrode.

With filter apparatuses according to preferred embodiments of the present invention, the first filter (low-band filter) and the second filter (high-band filter) each include the resonators in the plurality of stages between the two ground electrodes opposed to each other. The resonator in the first stage in the low-band filter includes the capacitor and the inductor connected in series between the two ground electrodes. The resonator in the first stage in the high-band filter is a closed-loop resonator in which the capacitor and the inductor are both connected to one of the ground electrodes. According to such a configuration, attenuation characteristics in the non-passband on a side of a lower frequency than the passband are able to be improved in each filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
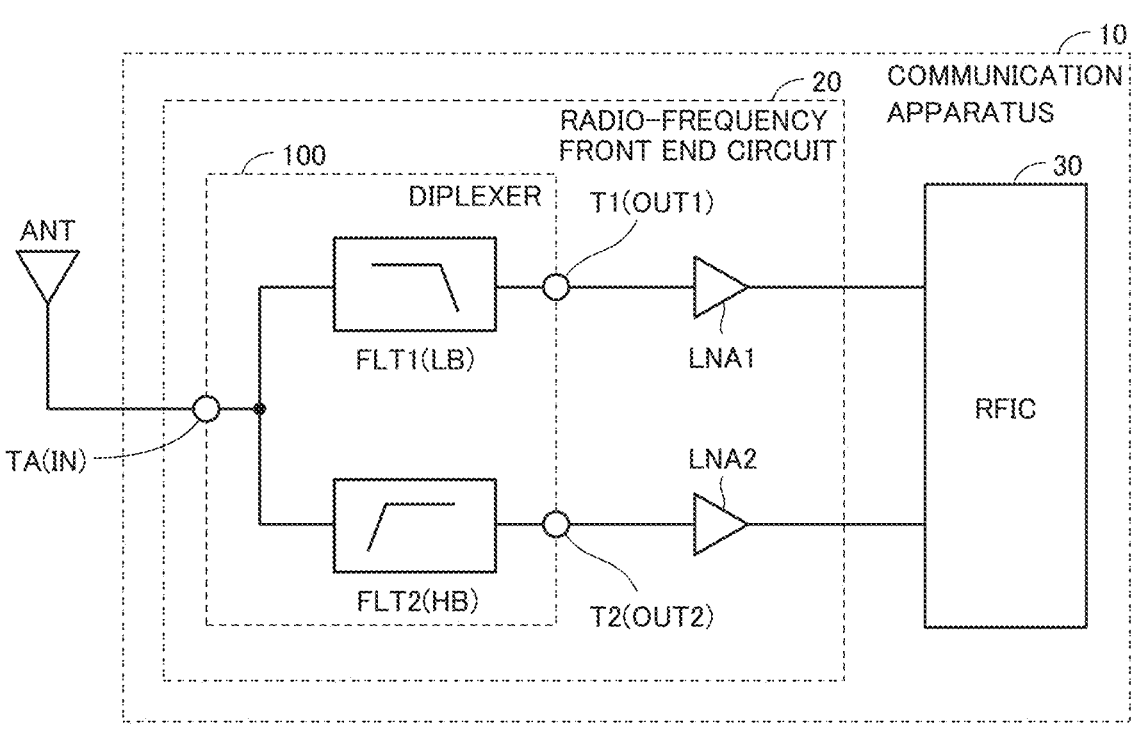
FIG. 1 is a block diagram of a communication apparatus including a radio-frequency front end circuit to which a filter apparatus according to a first preferred embodiment of the present invention is applied.

Preferred embodiments of the present disclosure will be described in detail below with reference to the drawings. The same or corresponding elements in the drawings are denoted by the same reference characters and description thereof will not be repeated.

First Preferred Embodiment

Basic Configuration of Communication Apparatus

FIG. 1 is a block diagram of a communication apparatus 10 including a radio-frequency front end circuit 20 to which a filter apparatus 100 according to a first preferred embodiment is applied. Radio-frequency front end circuit 20 separates a radio-frequency signal received by an antenna apparatus ANT into signals of a plurality of predetermined frequency bands and transmit the separated radio-frequency signals to a subsequent processing circuit. Radio-frequency front end circuit 20 is included, for example, in a portable terminal such as a portable telephone, a smartphone, or a tablet or a communication apparatus of a personal computer with a communication function.

Referring to FIG. 1, communication apparatus 10 includes radio-frequency front end circuit 20 including filter apparatus 100 and an RF signal processing circuit (which is also referred to as an "RFIC" below) 30. Radio-frequency front end circuit 20 shown in FIG. 1 is a reception front end circuit. Radio-frequency front end circuit 20 includes filter apparatus 100 and amplifier circuits LNA1 and LNA2.

Filter apparatus 100 includes an antenna terminal TA which is a common terminal, a first terminal T1, a second terminal T2, and filters FLT1 and FLT2. Filter apparatus 100 is a diplexer including filter FLT1 (first filter) and filter FLT2 (second filter) having frequency ranges different from each other as passbands. Filter apparatus 100 may be referred to as a "diplexer" in the description below.

Filter FLT1 is connected between antenna terminal TA and first terminal T1. Filter FLT1 is a low-band filter having a frequency range in a low-band (LB) group as the passband and a frequency range in a high-band (HB) group as a non-passband. Filter FLT2 is connected between antenna terminal TA and second terminal T2. Filter FLT2 is a high-band filter having a frequency range in the high-band group as the passband and having the frequency range in the low-band group as the non-passband. Filter FLT1 and filter FLT2 are each a band-pass filter.

Each of filters FLT1 and FLT2 allows passage of a radio-frequency signal corresponding to the passband of each filter, in the radio-frequency signal received by antenna apparatus ANT. The radio-frequency signal received by antenna apparatus ANT is thus separated into signals of a plurality of predetermined frequency bands.

Each of amplifier circuits LNA1 and LNA2 is a low-noise amplifier. Each of amplifier circuits LNA1 and LNA2 amplifies the radio-frequency signal that has passed through filter apparatus 100 with low noise, and transmits the resultant signal to RFIC 30.

RFIC 30 is an RF signal processing circuit that processes a radio-frequency signal that is received and to be transmitted by antenna apparatus ANT. Specifically, RFIC 30 subjects the radio-frequency signal inputted from antenna apparatus ANT through a reception-side signal path of radio-frequency front end circuit 20 to signal processing by, for example, down-conversion or the like, and outputs a reception signal generated as a result of the signal processing to a baseband signal processing circuit (not shown).

When radio-frequency front end circuit 20 is the reception front end circuit as in FIG. 1, in filter apparatus 100, antenna terminal TA defines and functions as an input terminal IN and first terminal T1 and second terminal T2 defines and functions as a first output terminal OUT1 and a second output terminal OUT2, respectively. The radio-frequency front end circuit can also be used as a transmission front end circuit. In this case, each of first terminal T1 and second terminal T2 of filter apparatus 100 defines and functions as the input terminal, and antenna terminal TA defines and functions as a common output terminal. In that case, a power amplifier instead of a low noise amplifier is provided as an amplifier included in the amplifier circuit.

Configuration of Filter Apparatus

Figure 2:
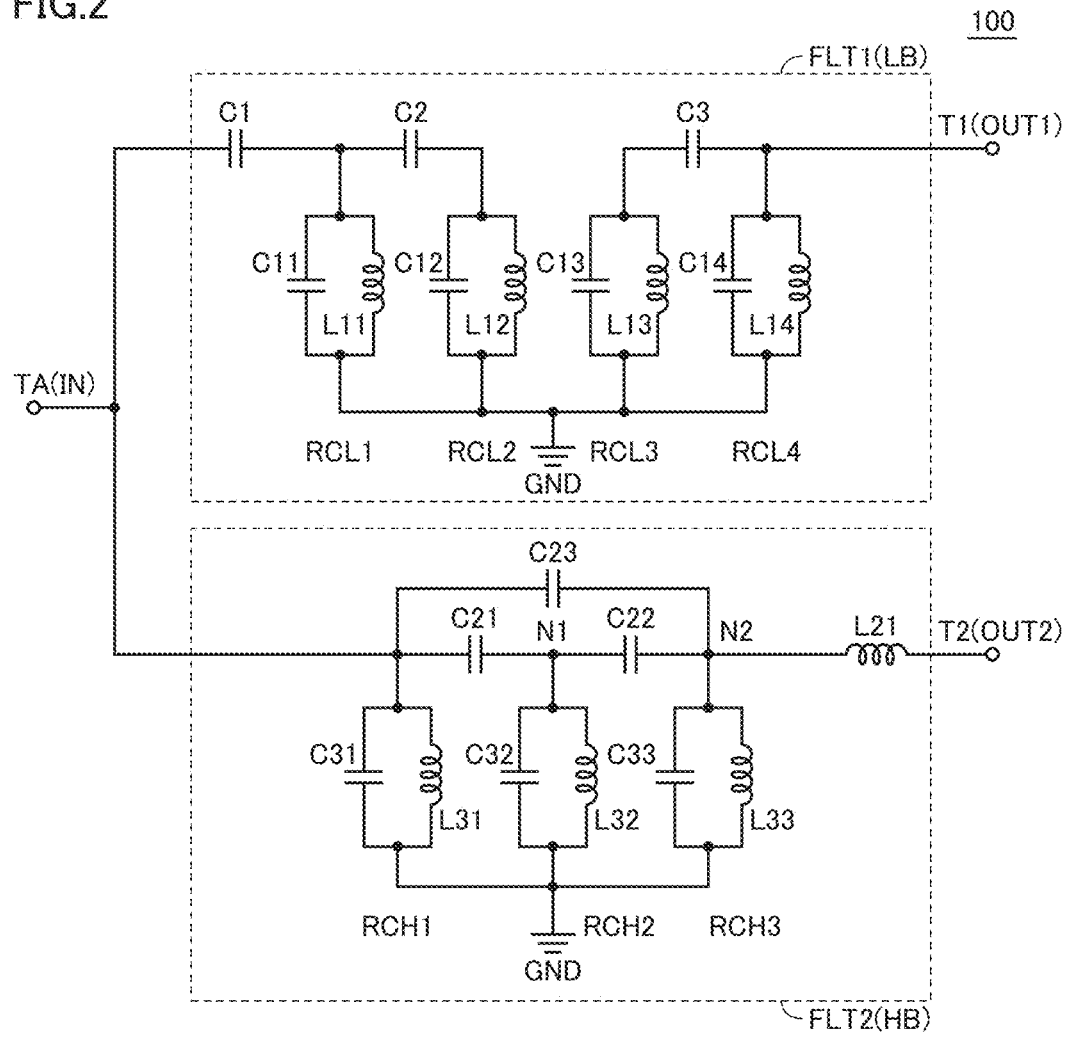
FIG. 2 is an equivalent circuit diagram of the filter apparatus according to the first preferred embodiment of the present invention.

FIG. 2 is a diagram showing an exemplary equivalent circuit of filter apparatus (diplexer) 100 in FIG. 1. As described with reference to FIG. 1, filter FLT1 is connected between antenna terminal TA and first terminal T1. Filter FLT2 is connected between antenna terminal TA and second terminal T2.

Each of filters FLT1 and FLT2 includes LC parallel resonators in a plurality of stages each including a capacitor and an inductor. Specifically, filter FLT1 includes resonators RCL1 to RCL4 which are LC parallel resonators, and filter FLT2 includes resonators RCH1 to RCH3 which are LC parallel resonators.

Filter FLT1 includes capacitors C1 to C3 in addition to resonators RCL1 to RCL4. Capacitor C1 includes one end connected to antenna terminal TA and the other end connected to resonator RCL1 and one end of capacitor C2. Resonator RCL1 is connected between the other end of capacitor C1 and a ground terminal GND. Resonator RCL1 includes a capacitor C11 and an inductor L11 connected in parallel between capacitor C1 and ground terminal GND. Resonator RCL2 is connected between the other end of capacitor C2 and ground terminal GND. Resonator RCL2 includes a capacitor C12 and an inductor L12 connected in parallel between capacitor C2 and ground terminal GND.

Capacitor C3 includes one end connected to first terminal T1 and the other end connected to resonator RCL3. Resonator RCL3 is connected between the other end of capacitor C3 and ground terminal GND. Resonator RCL3 includes a capacitor C13 and an inductor L13 connected in parallel between capacitor C3 and ground terminal GND. Resonator RCL4 is connected between first terminal T1 and ground terminal GND. Resonator RCL4 includes a capacitor C14 and an inductor L14 connected in parallel between first terminal T1 and ground terminal GND.

Filter FLT2 includes capacitors C21 to C23 and an inductor L21 in addition to resonators RCH1 to RCH3. Capacitors C21 and C22 and inductor L21 are connected in series between antenna terminal TA and second terminal T2. Capacitor C23 is connected in parallel to capacitors C21 and C22 connected in series.

Resonator RCH1 is connected between antenna terminal TA and ground terminal GND. Resonator RCH1 includes a capacitor C31 and an inductor L31 connected in parallel between antenna terminal TA and ground terminal GND.

Resonator RCH2 is connected between a connection node N1 between capacitor C21 and capacitor C22, and ground terminal GND. Resonator RCH2 includes a capacitor C32 and an inductor L32 connected in parallel between connection node N1 and ground terminal GND.

Resonator RCH3 is connected between a connection node N2 between capacitor C22 and inductor L21, and ground terminal GND. Resonator RCH3 includes a capacitor C33 and an inductor L33 connected in parallel between connection node N2 and ground terminal GND.

In filter FLT1, resonators RCL1 to RCL4 are magnetically coupled to one another. In filter FLT2, resonators RCH1 to RCH3 are magnetically coupled to one another. Since an attenuation pole is thus provided on a side of a higher frequency and a side of a lower frequency than the passband due to magnetic coupling between the resonators, filters FLT1 and FLT2 define and function as the band-pass filters.

In the exemplary filter apparatus 100 in the first preferred embodiment, the passband of filter FLT1 is set to, for example, about 6240 MHz to about 6740 MHz corresponding to a channel 5 (CH5) of ultra wide band (UWB) radio communication standards. The passband of filter FLT2 is set to, for example, about 7736 MHz to about 8238 MHz corresponding to channel 9 (CH9) of the UWB. Therefore, in filter apparatus 100, filter FLT1 defines and functions as the low-band filter and filter FLT2 defines and functions as the high-band filter.

Figure 3:
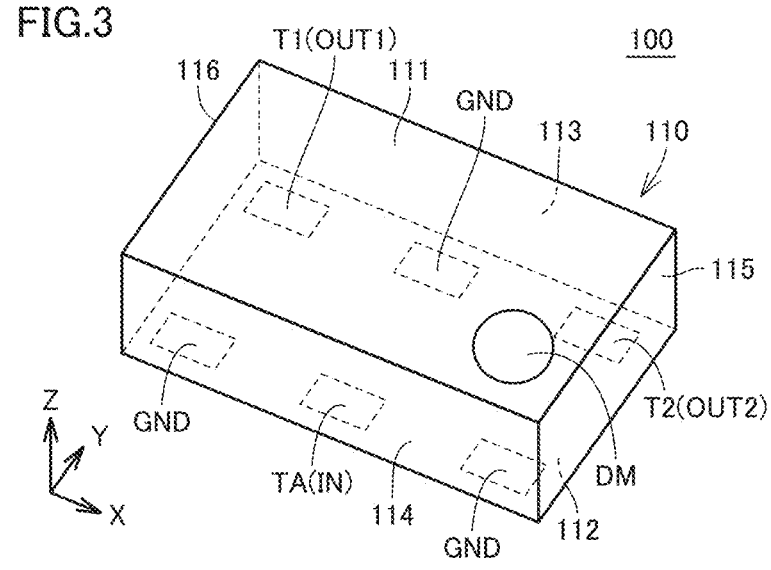
FIG. 3 is a diagram of an outer geometry of the filter apparatus according to the first preferred embodiment of the present invention.
Figure 4:
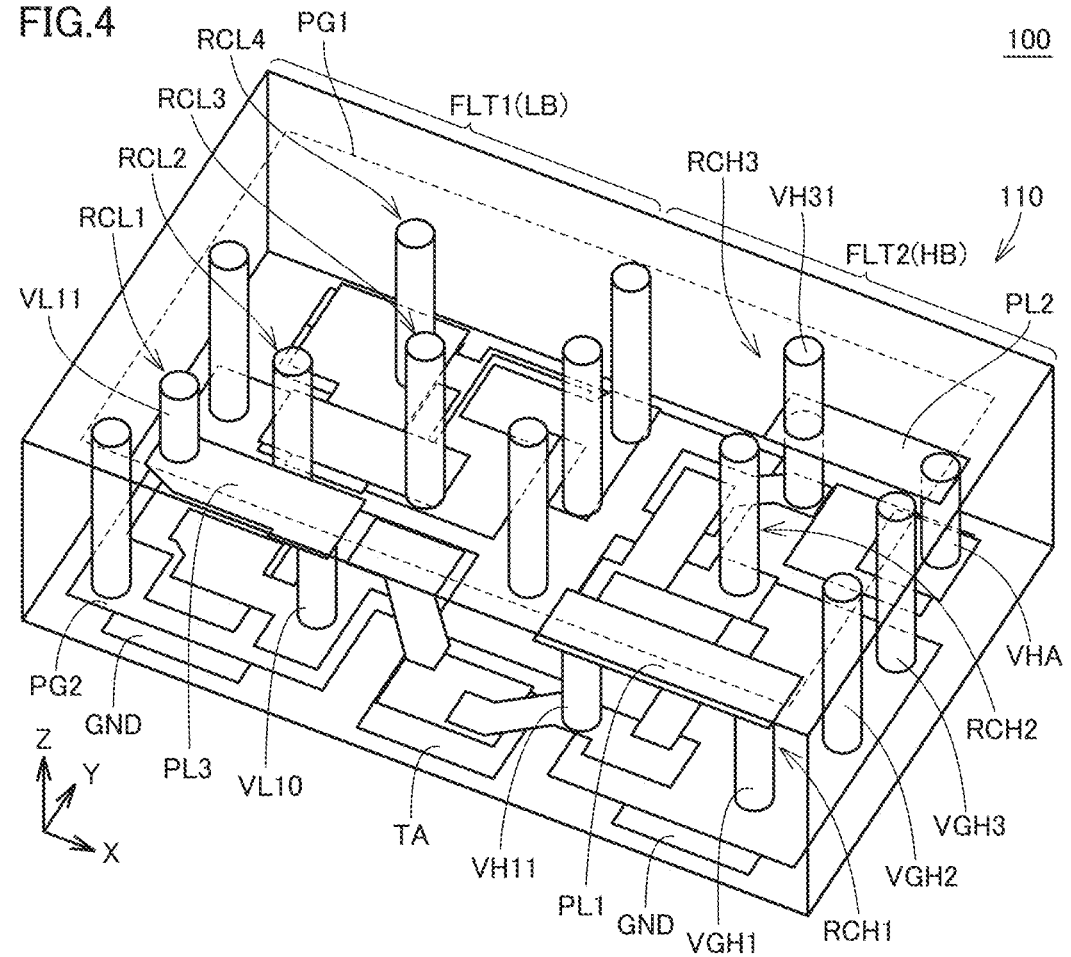
FIG. 4 is a perspective view showing the inside of the filter apparatus according to the first preferred embodiment of the present invention.
Figure 5:
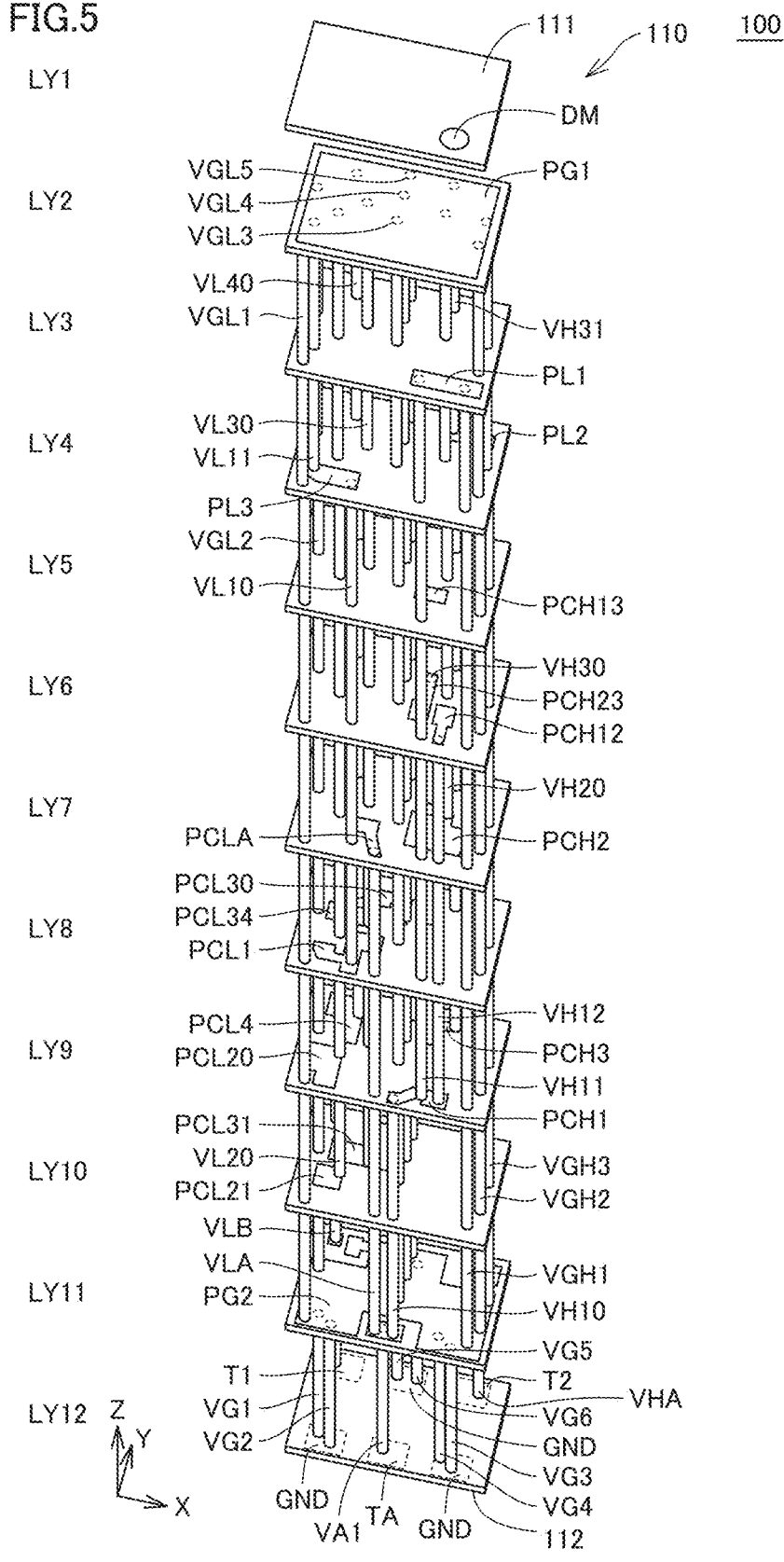
FIG. 5 is an exploded perspective view showing an exemplary detailed structure of the filter apparatus according to the first preferred embodiment of the present invention.

A detailed configuration of filter apparatus 100 will now be described with reference to FIGS. 3 to 5. FIG. 3 is a diagram of an outer geometry of filter apparatus 100. FIG. 4 is a perspective view showing the inside of filter apparatus 100 in FIG. 2. FIG. 5 is an exploded perspective view showing an exemplary detailed structure of filter apparatus 100.

Filter apparatus 100 includes a dielectric substrate 110 having a cuboid or substantially cuboid shape, dielectric substrate 110 including a plurality of dielectric layers LY1 to LY12 layered in a prescribed direction. Each dielectric layer in dielectric substrate 110 is made, for example, of ceramic such as low temperature co-fired ceramics (LTCC) or a resin. In the inside of dielectric substrate 110, the inductors and the capacitors that define filters FLT1 and FLT2 include a plurality of electrodes provided in the dielectric layers and a plurality of vias arranged between the dielectric layers. FIGS. 4 to 5 do not show the dielectric layers in dielectric substrate 110 and only show the electrodes, the vias, and conductors of terminals arranged in the inside of dielectric substrate 110. Although an example in which dielectric substrate 110 is a multi-layer substrate as described above will be described by way of example to facilitate illustration in the following explanation, dielectric substrate 110 may be a single-layer substrate.

The "via" herein refers to a conductor provided in a dielectric layer for connection between electrodes provided in different dielectric layers. The via is made, for example, from a conductive paste, plating, and/or a metallic pin. In the description below, a direction of layering of dielectric layers LY1 to LY12 in dielectric substrate 110 is defined as a "Z-axis direction," a direction along a long side of dielectric substrate 110 which is perpendicular or substantially perpendicular to the Z-axis direction is defined as an "X-axis direction," and a direction along a short side of dielectric substrate 110 is defined as a "Y-axis direction." A positive direction along the Z axis in each figure may be referred to as an upper side and a negative direction may be referred to as a lower side below.

Referring to FIGS. 3 to 5, dielectric substrate 110 includes an upper surface 111, a lower surface 112, and side surfaces 113 to 116. A directional mark DM to specify a direction of filter apparatus 100 is provided on upper surface 111 (a first layer LY1) of dielectric substrate 110. As shown in FIG. 3, an external terminal (antenna terminal TA, first terminal T1, second terminal T2, and ground terminal GND) for connection between filter apparatus 100 and an external apparatus is provided on lower surface 112 (a twelfth layer LY12) of dielectric substrate 110. In other words, antenna terminal TA, first terminal T1, second terminal T2, and ground terminal GND define a land grid array (LGA).

In FIG. 4, generally, filter FLT1 is provided in a left (the negative direction along the X axis) portion of dielectric substrate 110 and filter FLT2 is provided in a right (the positive direction along the X axis) portion thereof. In filter FLT1, resonators RCL1 to RCL4 are sequentially arranged from side surface 114 in the negative direction along the Y axis of dielectric substrate 110 toward side surface 113 in the positive direction along the Y axis. In filter FLT2, resonators RCH1 to RCH3 are sequentially arranged from side surface 114 toward side surface 113 of dielectric substrate 110.

Details of filter FLT1 will initially be described. Referring to FIG. 5, antenna terminal TA provided on lower surface 112 (twelfth layer LY12) of dielectric substrate 110 is connected to a capacitor electrode PCLA provided in a seventh layer LY7 through a via VA1 and a via VLA. When dielectric substrate 110 is viewed in plan view from the Z-axis direction, a portion of capacitor electrode PCLA overlaps with a portion of a capacitor electrode PCL1 arranged in a ninth layer LY9. Capacitor C1 in FIG. 2 includes capacitor electrode PCLA and capacitor electrode PCL1.

Capacitor electrode PCL1 is connected through a via VL10 to one end of a linear plate electrode PL3 provided in a fourth layer LY4. Plate electrode PL3 has the other end connected to a via VL11. Plate electrode PL3 is connected to a plate electrode PG1 provided over the entire or substantially the entire surface of a second layer LY2 through via VL11. Inductor L11 in FIG. 2 includes vias VL10 and VL11 and plate electrode PL3.

Plate electrode PG1 is connected, through vias VGL1 to VGL5, VGH2, and VGH3, to a plate electrode PG2 provided in an eleventh layer LY11. Plate electrode PG2 is connected through vias VG1 to VG6 to ground terminal GND provided on lower surface 112 (twelfth LY12) of dielectric substrate 110. In other words, plate electrodes PG1 and PG2 define and function as the ground electrodes.

When dielectric substrate 110 is viewed in plan view from the Z-axis direction, a portion of capacitor electrode PCL1 also overlaps with a portion of plate electrode PG2 in eleventh layer LY11. Capacitor C11 in FIG. 2 includes capacitor electrode PCL1 and plate electrode PG2. Therefore, resonator RCL1 includes vias VL10 and VL11, plate electrode PL3, capacitor electrode PCL1, and plate electrode PG2.

When dielectric substrate 110 is viewed in plan view from the Z-axis direction, a portion of capacitor electrode PCL1 also overlaps with a capacitor electrode PCL20 provided in ninth layer LY9. Capacitor C2 in FIG. 2 includes capacitor electrode PCL1 and capacitor electrode PCL20.

Capacitor electrode PCL20 is connected through a via VL20 to a capacitor electrode PCL21 provided in a tenth layer LY10 and plate electrode PG1 in second layer LY2. Via VL20 corresponds to inductor L12 in FIG. 2. When dielectric substrate 110 is viewed in plan view from the Z-axis direction, a portion of capacitor electrode PCL20 and a portion of capacitor electrode PCL21 overlap with plate electrode PG2 in eleventh layer LY11. Capacitor C12 in FIG. 2 includes capacitor electrodes PCL20 and PCL21 and plate electrode PG2. Therefore, resonator RCL2 includes capacitor electrodes PCL20 and PCL21 and via VL20.

A capacitor electrode PCL31 is provided in tenth layer LY10. Capacitor electrode PCL31 is connected through a via VL30 to a capacitor electrode PCL34 provided in an eighth layer LY8 and plate electrode PG1 in second layer LY2. Via VL30 corresponds to inductor L13 in FIG. 2. In eighth layer LY8, a capacitor electrode PCL30 connected to vias VGL5 and VGL6 is provided. When dielectric substrate 110 is viewed in plan view from the Z-axis direction, capacitor electrode PCL31 overlaps with plate electrode PG2 in eleventh layer LY11 and capacitor electrode PCL30. In other words, capacitor C13 in FIG. 2 includes capacitor electrodes PCL30 and PCL31 and plate electrode PG2. Therefore, resonator RCL3 includes capacitor electrodes PCL30 and PCL31 and via VL30.

When dielectric substrate 110 is viewed in plan view from the Z-axis direction, a portion of capacitor electrode PCL34 in eighth layer LY8 overlaps with a portion of a capacitor electrode PCL4 provided in ninth layer LY9. Capacitor C3 in FIG. 2 includes capacitor electrode PCL34 and capacitor electrode PCL4. When dielectric substrate 110 is viewed in plan view from the Z-axis direction, a portion of capacitor electrode PCL4 also overlaps with plate electrode PG2 in eleventh layer LY11. Capacitor C14 in FIG. 2 includes capacitor electrode PCL4 and plate electrode PG2. Capacitor electrode PCL4 is connected to plate electrode PG1 in second layer LY2 through a via VL40. Via VL40 corresponds to inductor L14 in FIG. 2. Therefore, resonator RCL4 includes capacitor electrode PCL4 and via VL40.

Capacitor electrode PCL4 is connected through a via VLB to first terminal T1 provided on lower surface 112 (twelfth layer LY12). According to such a configuration, a signal within a range of the passband of filter FLT1 in the radio-frequency signal received by antenna terminal TA propagates through resonator RCL1, resonator RCL2, resonator RCL3, and resonator RCL4 and is outputted from first terminal T1.

Details of filter FLT2 will now be described. Antenna terminal TA provided on lower surface 112 of dielectric substrate 110 is connected through via VA1 and a via VH10 to a capacitor electrode PCH1 provided in ninth layer LY9. When dielectric substrate 110 is viewed in plan view from the Z-axis direction, a portion of capacitor electrode PCH1 overlaps with plate electrode PG2 in eleventh layer LY11. Capacitor C31 in FIG. 2 includes capacitor electrode PCH1 and plate electrode PG2.

Capacitor electrode PCH1 is connected through a via VH11 to one end of a linear plate electrode PL1 provided in a third layer LY3. Plate electrode PL1 includes the other end connected to a via VGH1. Capacitor electrode PCH1 is connected to plate electrode PG2 in eleventh layer LY11 through via VGH1. Inductor L31 in FIG. 2 includes vias VH11 and VGH1 and plate electrode PL1. Therefore, resonator RCH1 includes capacitor electrode PCH1, vias VH11 and VGH1, and plate electrode PL1.

Capacitor electrode PCH1 is further connected through a via VH12 to a capacitor electrode PCH12 provided in a sixth layer LY6. When dielectric substrate 110 is viewed in plan view from the Z-axis direction, a portion of capacitor electrode PCH12 overlaps with a capacitor electrode PCH2 provided in seventh layer LY7. Capacitor C21 in FIG. 2 includes capacitor electrode PCH12 and capacitor electrode PCH2.

When dielectric substrate 110 is viewed in plan view from the Z-axis direction, capacitor electrode PCH2 overlaps with a capacitor electrode PCH23 provided in sixth layer LY6 and plate electrode PG2 in eleventh layer LY11. Capacitor C23 in FIG. 2 includes capacitor electrode PCH2 and capacitor electrode PCH23. Capacitor C32 in FIG. 2 includes capacitor electrode PCH2 and plate electrode PG2.

Capacitor electrode PCH2 is connected to plate electrode PG1 in second layer LY2 through a via VH20. Via VH20 corresponds to inductor L32 in FIG. 2. Therefore, resonator RCH2 includes capacitor electrode PCH2 and via VH20.

When dielectric substrate 110 is viewed in plan view from the Z-axis direction, capacitor electrodes PCH2 and PCH23 in sixth layer LY6 overlap with a capacitor electrode PCH13 arranged in a fifth layer LY5. Capacitor C13 in FIG. 2 includes capacitor electrodes PCH12, PCH23, and PCH13.

Capacitor electrode PCH23 is further connected through a via VH30 to a capacitor electrode PCH3 in ninth layer LY9. When dielectric substrate 110 is viewed in plan view from the Z-axis direction, a portion of capacitor electrode PCH3 overlaps with plate electrode PG2 in eleventh layer LY11. In other words, capacitor C33 in FIG. 2 includes capacitor electrode PCH3 and plate electrode PG2.

Capacitor electrode PCH3 is connected through a via VH31 to plate electrode PG1 in second layer LY2 and plate electrode PL2 in fourth layer LY4. Via VH31 corresponds to inductor L33 in FIG. 2. Therefore, resonator RCH3 includes capacitor electrode PCH3 and via VH31.

As shown in FIG. 4, plate electrode PL2 in fourth layer LY4 is connected to second terminal T2 on lower surface 112 (twelfth layer LY12) through a via VHA. Inductor L21 in FIG. 2 includes plate electrode PL2 and via VHA.

According to such a configuration, a signal within a range of the passband of filter FLT2 in the radio-frequency signal received by antenna terminal TA propagates through resonator RCH1, resonator RCH2, and resonator RCH3 and is outputted from second terminal T2.

As shown in FIG. 4, in filter apparatus 100 in the first preferred embodiment, resonator RCL1 in the first stage in filter FLT1 which is the low-band filter includes capacitor C11 connected to plate electrode PG2 and inductor L11 connected between capacitor C11 and plate electrode PG1. Capacitor C11 includes capacitor electrode PCL1 and plate electrode PG2, and inductor L11 includes vias VL10 and VL11 and plate electrode PL3. Therefore, resonator RCL1 is connected between plate electrode PG1 and plate electrode PG2.

Resonator RCH1 in the first stage in filter FLT2 which is the high-band filter includes capacitor C31 connected to plate electrode PG2 and inductor L31 connected between capacitor C31 and plate electrode PG2. In other words, the resonator is configured such that both of capacitor C31 and inductor L31 are connected to plate electrode PG2 but not connected to plate electrode PG1. Capacitor C31 includes capacitor electrode PCH1 and plate electrode PG2 and inductor L31 includes vias VH11 and VGH1 and plate electrode PL1. Inductor L31 is in a form of a loop. Therefore, resonator RCH1 is a closed-loop resonator including the inductor in the form of the loop.

The configuration of the resonator in which the inductor and the capacitor are connected in series between two ground electrodes of plate electrodes PG1 and PG2 as in filter FLT1 which is the low-band filter has an inductance smaller than the inductor in the form of the loop. Since the resonator is directly connected to plate electrode PG1 shared with other resonators, coupling to an adjacent resonator is stronger. Such a configuration can achieve attenuation characteristics having a larger attenuation amount on a higher frequency side than the passband of filter FLT1 which is the low-band filter.

On the other hand, in the case of the configuration including the inductor in the form of the loop as in resonator RCH1 of filter FLT2 which is the high-band filter, orientations of currents flowing through opposing vias are opposite to each other. Thus, magnetic fluxes in an air core of an annular inductor including vias VL10 and VL11 and plate electrode PL3 are strengthened and the value of the inductance can be larger. Since resonator RCH1 is not connected to plate electrode PG1 of the ground electrode shared by the resonators in the plurality of stages, coupling to another adjacent resonator becomes weaker. Therefore, with the closed-loop resonator being provided as resonator RCH1, such a configuration can achieve attenuation characteristics having a larger attenuation amount on a lower frequency side than the passband in resonator RCH1.

Figure 6:
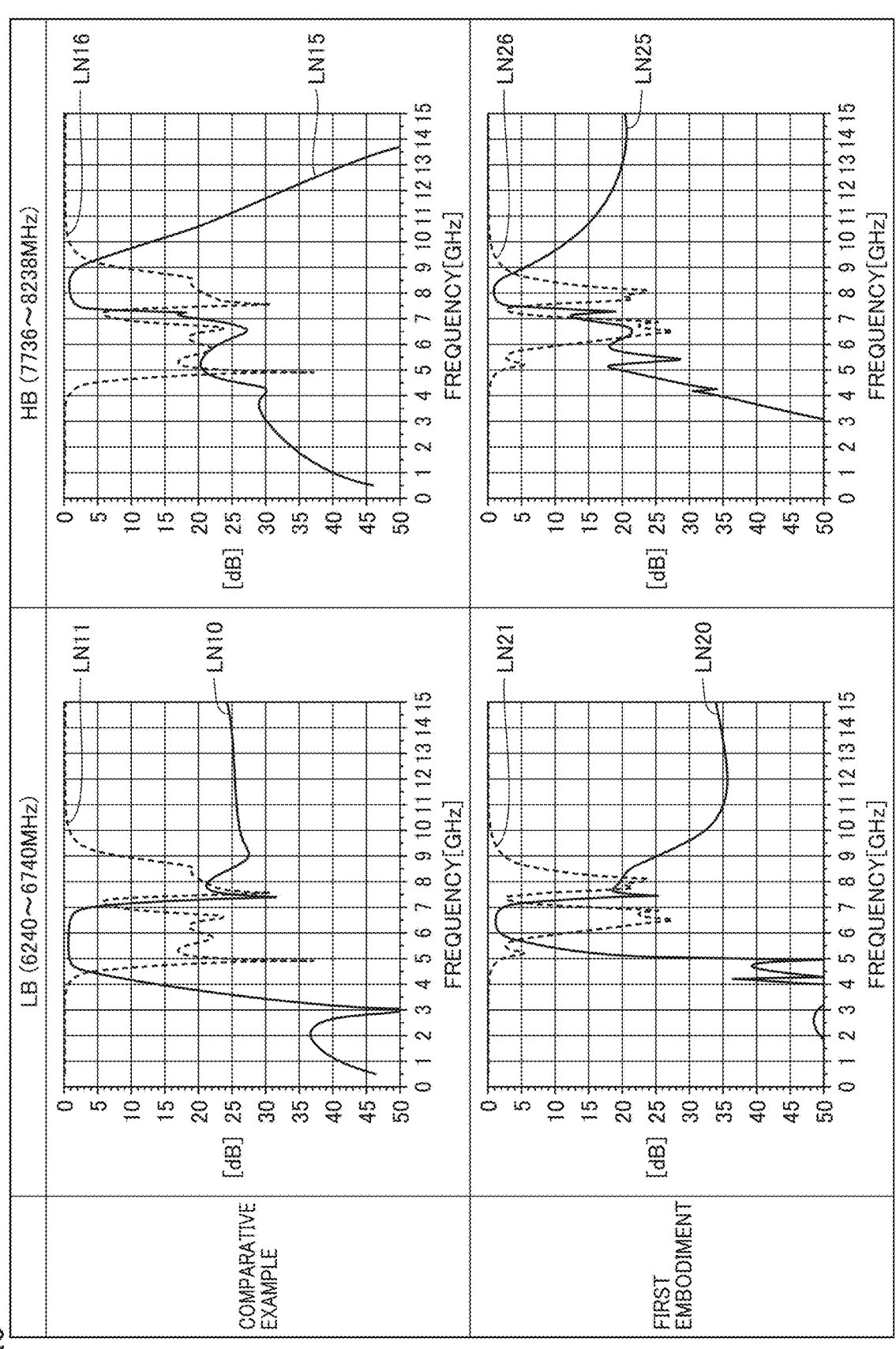
FIG. 6 is a diagram for illustrating pass characteristics of the filter apparatus according to the first preferred embodiment of the present invention and a filter apparatus in a comparative example.

FIG. 6 is a diagram for illustrating pass characteristics of filter apparatus 100 in the first preferred embodiment and a filter apparatus in a comparative example. Although not shown, in the filter apparatus of the comparative example, in contrast to filter apparatus 100 in the first preferred embodiment, the resonator in the first stage in the low-band filter is defined by a closed-loop resonator, and the resonator in the first stage in the high-band filter is defined by a resonator not including the inductor in the form of the loop. FIG. 6 shows insertion loss and return loss of the low-band filter and the high-band filter. The insertion loss is shown with solid lines LN10, LN15, LN20, and LN25. The return loss is shown with dashed lines LN11, LN16, LN21, and LN26.

As shown in FIG. 6, filter apparatus 100 in the first preferred embodiment has a significantly larger attenuation amount in a frequency band around about 0 GHz to about 5 GHz which is lower than the passband, and a greater steepness of attenuation, in each of the low-band filter and the high-band filter.

As set forth above, in the filter apparatus (diplexer) in which each filter includes resonators in the plurality of stages, the resonator in the first stage in the high-band filter is structured as the closed-loop resonator and the resonator in the first stage in the low-band filter is structured as a non-loop type resonator. Such a configuration can improve attenuation characteristics in the non-passband on the lower frequency side than the passband.

Although the diplexer in which the filter apparatus includes two filters is described by way of example in the description above, the features in the present disclosure may be applied to a multiplexer including at least three filters.

"Filter FLT1" and "filter FLT2" in the present first preferred embodiment correspond to the "first filter" and the "second filter" in the present disclosure, respectively. "Plate electrode PG1" and "plate electrode PG2" in the present first preferred embodiment correspond to the "first ground electrode" and the "second ground electrode" in the present disclosure, respectively. "Capacitor C11" and "capacitor C31" in the present first preferred embodiment correspond to the "first capacitor" and the "second capacitor" in the present disclosure, respectively. "Inductor L11" and "inductor L31" in the present first preferred embodiment correspond to the "first inductor" and the "second inductor" in the present disclosure, respectively. "Via VH11" and "via VGH1" in the present first preferred embodiment correspond to the "first via" and the "second via" in the present disclosure, respectively. "Plate electrode PL1" in the present first preferred embodiment corresponds to the "first line electrode" in the present disclosure. "Via VL10" and "via VL11" in the present first preferred embodiment correspond to the "sixth via" and the "seventh via" in the present disclosure, respectively. "Plate electrode PL3" in the present first preferred embodiment corresponds to the "second line electrode" in the present disclosure.

Second Preferred Embodiment

Figure 7:
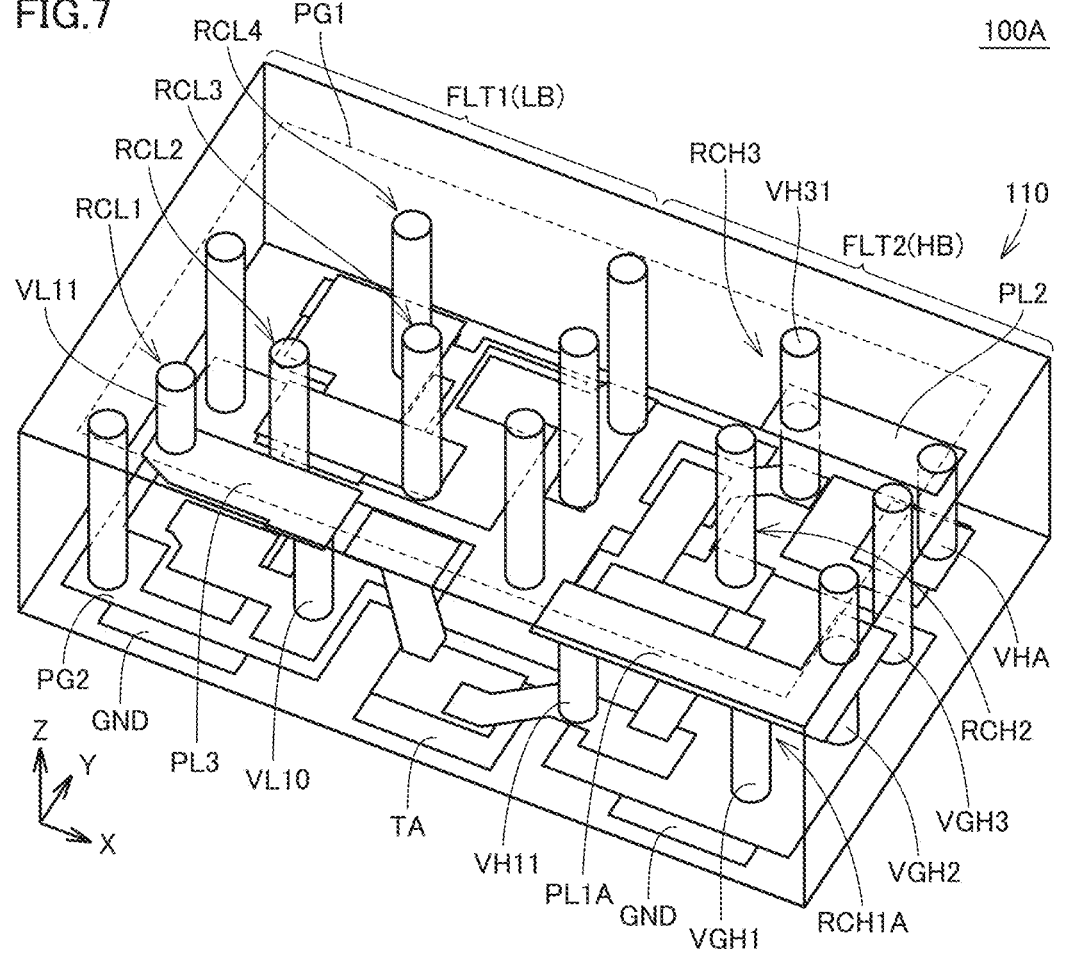
FIG. 7 is a perspective view showing the inside of a filter apparatus according to a second preferred embodiment of the present invention.

Another configuration of a resonator in a first stage in a high-band filter will be described in a second preferred embodiment of the present invention.
Configuration of Filter Apparatus FIG. 7 is a perspective view showing the inside of a filter apparatus 100A according to a second preferred embodiment. In FIG. 7, resonator RCH1 of filter FLT2 which is the high-band filter in filter apparatus 100 shown in FIG. 4 is replaced with a resonator RCH1A. More specifically, plate electrode PL1 in resonator RCH1 is replaced with a plate electrode PL1A. Plate electrode PL1A is in an L or substantially an L shape when it is viewed in plan view from the Z-axis direction, and is also connected to via VGH2 in addition to vias VH11 and VGH1. In other words, resonator RCH1A is a closed-loop resonator including vias VH11 and VGH1 and plate electrode PL1A, and is connected to both of plate electrodes PG1 and PG2 through via VGH2. By connecting the closed-loop resonator to plate electrode PG1 which is a shared ground electrode, coupling with another adjacent resonator can be stronger than in resonator RCH1 in the first preferred embodiment.

Figure 8:
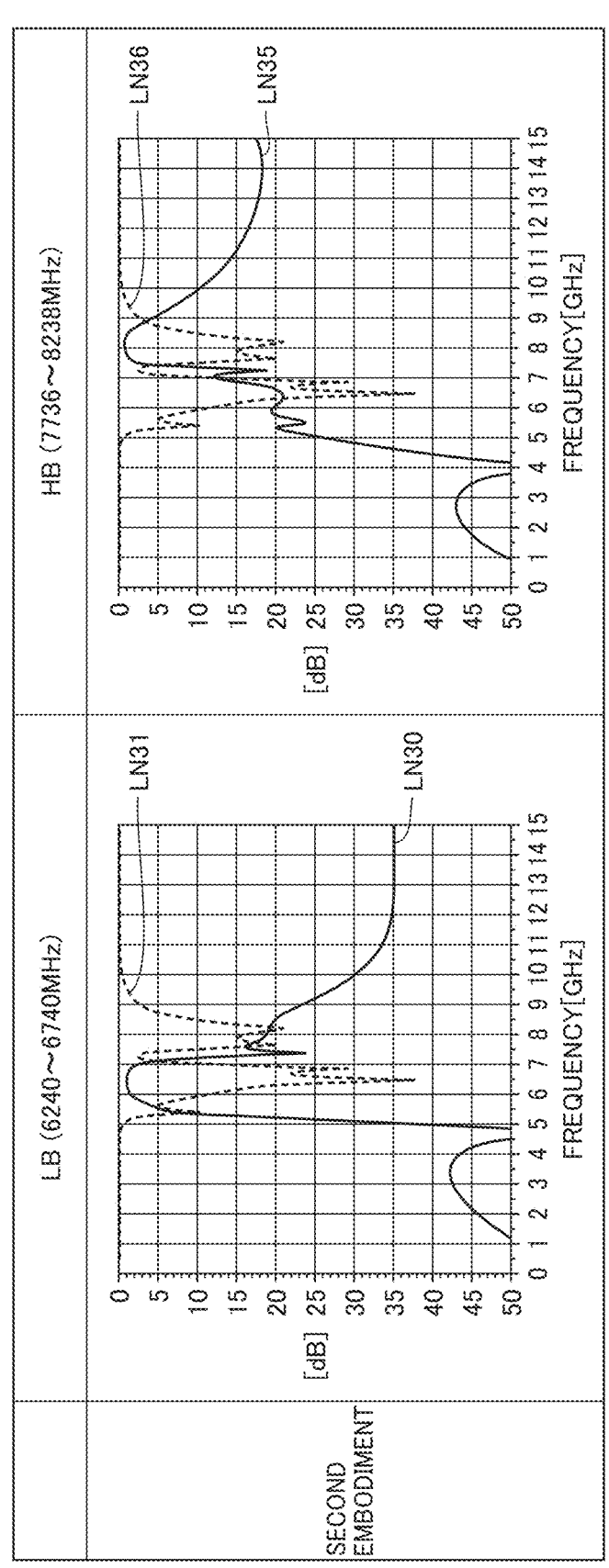
FIG. 8 is a diagram for illustrating pass characteristics of the filter apparatus according to the second preferred embodiment of the present invention.

The configuration of filter apparatus 100A in the second preferred embodiment other than resonator RCH1A is the same or substantially the same as in filter apparatus 100, and description of the same or corresponding elements as in filter apparatus 100 will not be repeated.
Pass Characteristics FIG. 8 is a diagram for illustrating pass characteristics of filter apparatus 100A in the second preferred embodiment. In FIG. 8, solid lines LN30 and LN35 represent insertion loss and dashed lines LN31 and LN36 represent return loss.

Referring to FIG. 8, in the configuration of filter apparatus 100A as well, the attenuation amount in the frequency band on the lower frequency side than the passband is larger than in the filter apparatus in the comparative example in FIG. 6. Since coupling with an adjacent resonator is stronger than in filter apparatus 100 in the first preferred embodiment, the attenuation amount in the entire frequency band on the lower frequency side than the passband is slightly smaller, whereas the attenuation amount around 5 GHz is larger than in filter apparatus 100 in the first preferred embodiment.

By connecting resonator RCH1A defined by the closed-loop resonator to a common ground electrode, a degree of coupling to an adjacent resonator can be adjusted while maintaining an inductance. Thus, in filter apparatus 100A, the attenuation amount in the frequency band on the lower frequency side than the passband can be larger, and in particular, the attenuation amount around 5 GHz can be larger.

"Plate electrode PL1A" in the second preferred embodiment corresponds to the "first line electrode" in the present disclosure. "Via VGH2" in the second preferred embodiment corresponds to the "third via" in the present disclosure.

Third Preferred Embodiment

Figure 9:
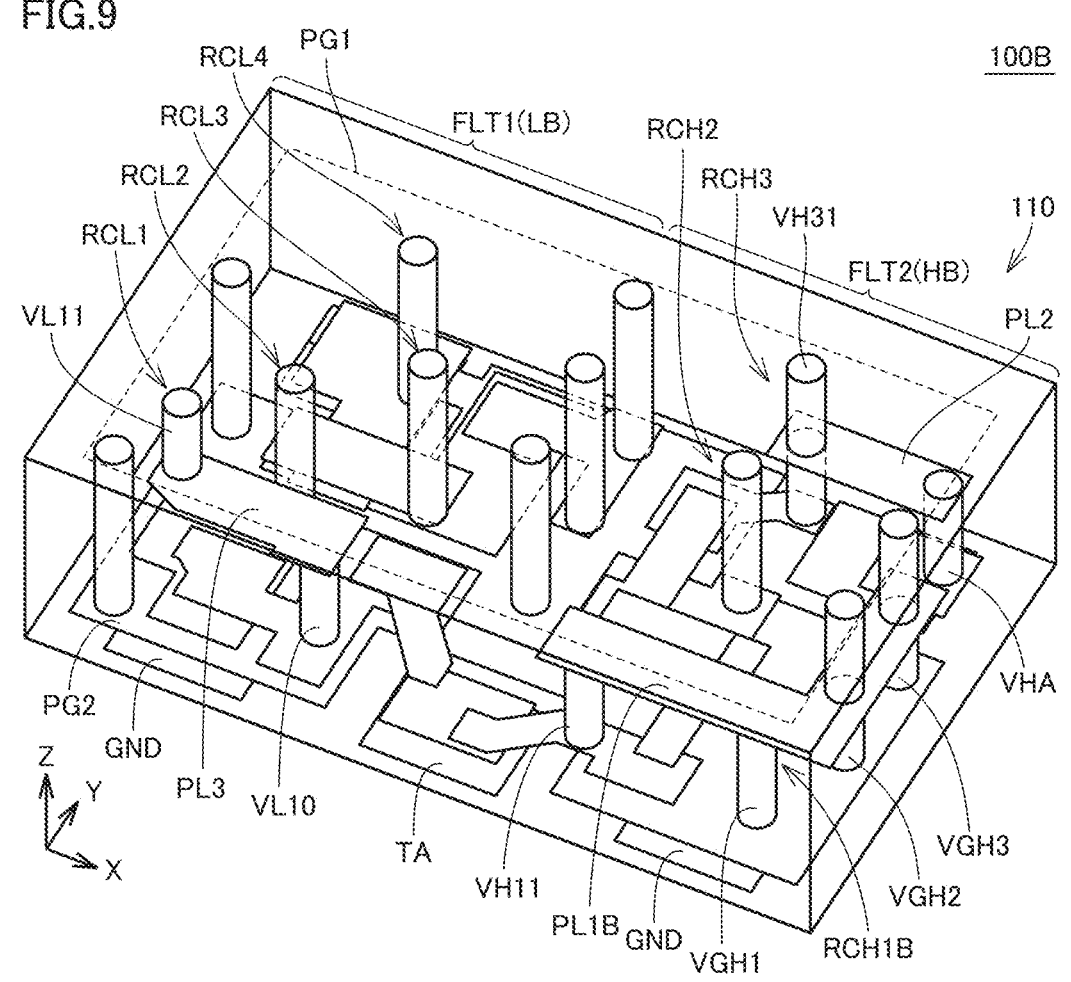
FIG. 9 is a perspective view showing the inside of a filter apparatus according to a third preferred embodiment of the present invention.

Yet another configuration of a resonator in a first stage in a high-band filter will be described in a third preferred embodiment of the present invention.
Configuration of Filter Apparatus FIG. 9 is a perspective view showing the inside of a filter apparatus 100B according to a third preferred embodiment of the present invention. In FIG. 9, resonator RCH1 of the high-band filter in filter apparatus 100 shown in FIG. 4 is replaced with a resonator RCH1B. More specifically, plate electrode PL1 in resonator RCH1 is replaced with a plate electrode PL1B. Plate electrode PL1B is in an L or substantially an L shape when it is viewed in plan view from the Z-axis direction, and is also connected to vias VGH2 and VGH3 in addition to vias VH11 and VGH1. In other words, resonator RCH1B is a closed-loop resonator including vias VH11 and VGH1 and plate electrode PL1B, and is connected to both of plate electrodes PG1 and PG2 through vias VGH2 and VGH3. Therefore, while maintaining an inductance in resonator RCH1B as in the second preferred embodiment, coupling to an adjacent resonator can further be stronger than in the second preferred embodiment.

The configuration of filter apparatus 100B in the third preferred embodiment other than resonator RCH1B is the same or substantially the same as in filter apparatus 100, and description of the same or corresponding elements as in filter apparatus 100 will not be repeated.

Pass Characteristics

Figure 10:
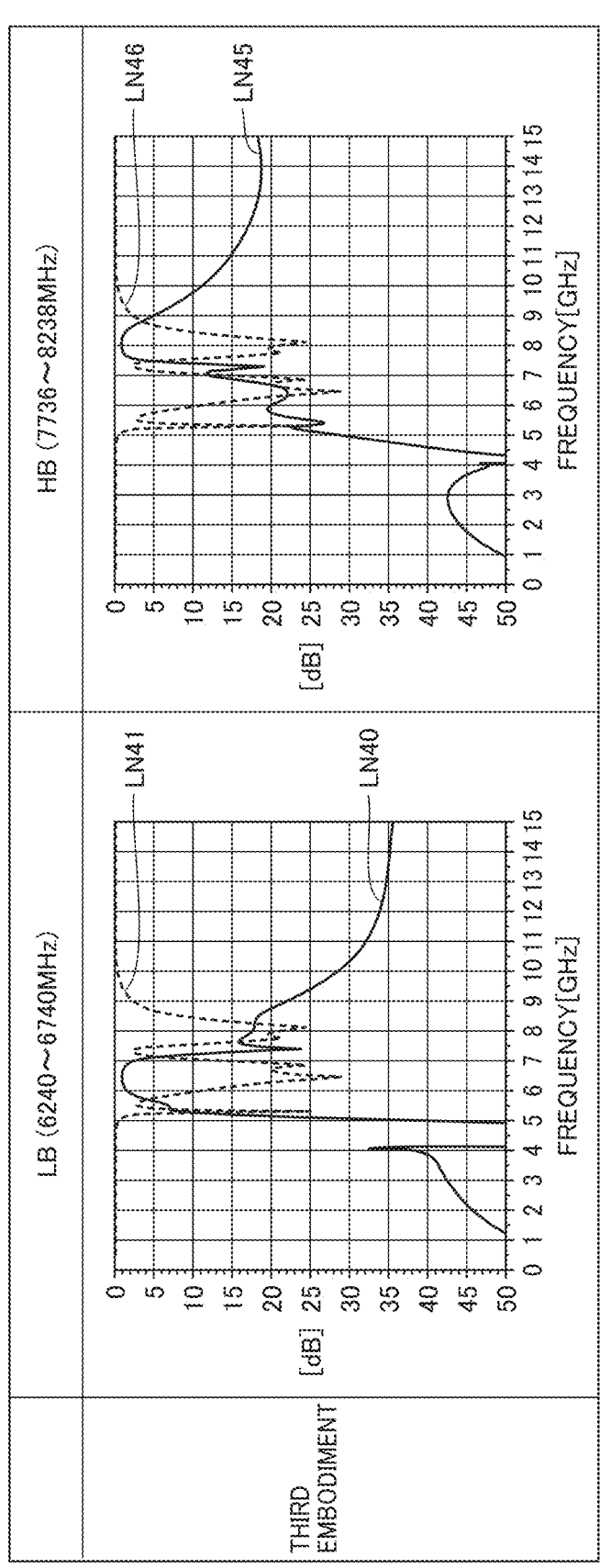
FIG. 10 is a diagram for illustrating pass characteristics of the filter apparatus according to the third preferred embodiment of the present invention.

FIG. 10 is a diagram for illustrating pass characteristics of filter apparatus 100B in the third preferred embodiment. In FIG. 10, solid lines LN40 and LN45 represent insertion loss and dashed lines LN41 and LN46 represent return loss.

Referring to FIG. 10, in the configuration of filter apparatus 100B as well, the attenuation amount in the frequency band on the lower frequency side than the passband is larger than in the filter apparatus in the comparative example in FIG. 6. The attenuation amount around 4 GHz to 5 GHz is larger also in filter apparatus 100B than in filter apparatus 100 in the first preferred embodiment.

By connecting resonator RCH1B defined by the closed-loop resonator to a common ground electrode, a degree of coupling to an adjacent resonator can be adjusted while maintaining an inductance. Thus, in filter apparatus 100B, the attenuation amount in the frequency band on the lower frequency side than the passband can be larger, and in particular, the attenuation amount around 4 GHz to 5 GHz can be larger.

"Plate electrode PL1B" in the third preferred embodiment corresponds to the "first line electrode" in the present disclosure. "Via VGH2" and "via VGH3" in the third preferred embodiment correspond to the "third via" and the "fourth via" in the present disclosure, respectively.

Fourth Preferred Embodiment

Yet another configuration of a resonator in a first stage in a high-band filter will be described in a fourth preferred embodiment of the present invention.

Configuration of Filter Apparatus

Figure 11:
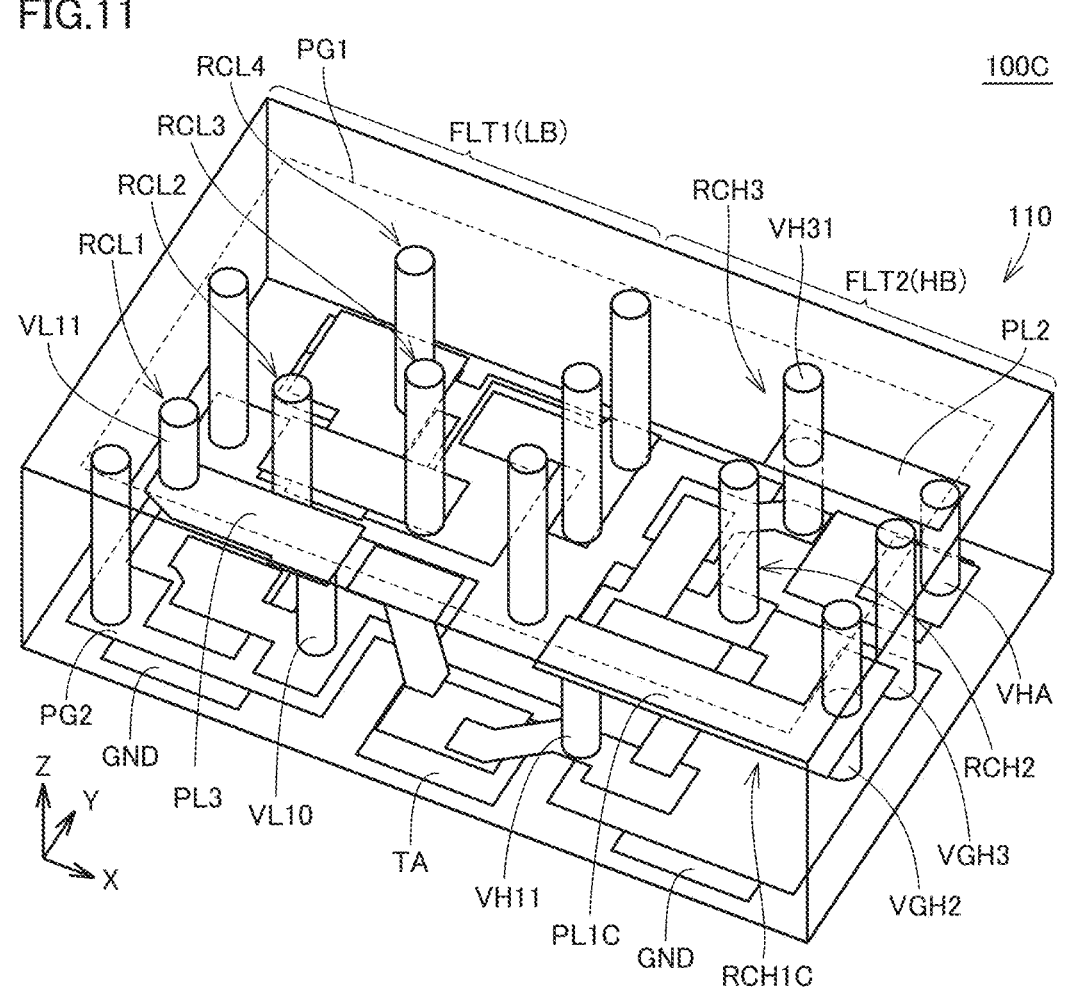
FIG. 11 is a perspective view showing the inside of a filter apparatus according to a fourth preferred embodiment of the present invention.

FIG. 11 is a perspective view showing the inside of a filter apparatus 100C according to the fourth preferred embodiment. In FIG. 11, resonator RCH1 of filter FLT2 which is the high-band filter in filter apparatus 100 shown in FIG. 4 is replaced with a resonator RCH1C. More specifically, plate electrode PL1 in resonator RCH1 is replaced with a plate electrode PL1C and via VGH1 is removed. Plate electrode PL1C is in an L or substantially an L shape when it is viewed in plan view from the Z-axis direction and is connected to via VH11 and via VGH2.

In other words, resonator RCH1 is a closed-loop resonator including vias VH11 and VGH2 and plate electrode PL1C, and is further connected to plate electrode PG1 through via VGH2.

The configuration of filter apparatus 100C in the fourth preferred embodiment other than resonator RCH1C is the same or substantially the same as in filter apparatus 100, and description of the same or corresponding elements as in filter apparatus 100 will not be repeated.

Pass Characteristics

Figure 12:
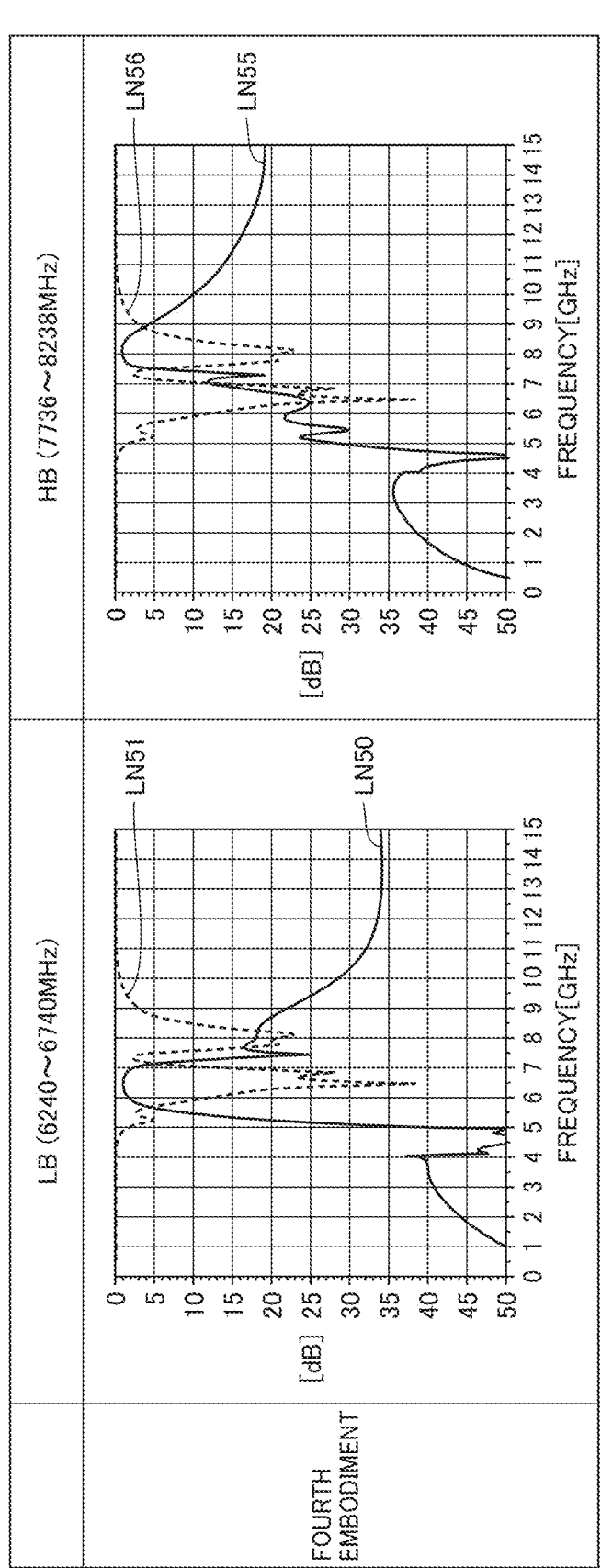
FIG. 12 is a diagram for illustrating pass characteristics of the filter apparatus according to the fourth preferred embodiment of the present invention.

FIG. 12 is a diagram for illustrating pass characteristics of filter apparatus 100C in the fourth preferred embodiment. In FIG. 12, solid lines LN50 and LN55 represent insertion loss and dashed lines LN51 and LN56 represent return loss.

Referring to FIG. 12, in the configuration of filter apparatus 100C as well, the attenuation amount in the frequency band on the lower frequency side than the passband is larger than in the filter apparatus in the comparative example in FIG. 6. In resonator RCH1C, the inductor in the form of the loop includes via VGH2 instead of via VGH1. Therefore, an air core diameter of the inductor in the form of the loop is larger than in resonator RCH1 in the first preferred embodiment, and resonator RCH1C is better in quality factor than resonator RCH1. Reduction in insertion loss can thus be expected, although it is not clearly shown in a characteristic diagram in FIG. 12.

"Plate electrode PL1C" in the fourth preferred embodiment corresponds to the "first line electrode" in the present disclosure. In the fourth preferred embodiment, a portion between plate electrode PL1C and plate electrode PG2 in "via VGH2" corresponds to the "second via" in the present disclosure, and a portion between plate electrode PL1C and plate electrode PG1 in "via VGH2" corresponds to the "fifth via" in the present disclosure.

Fifth Preferred Embodiment

Another configuration of a resonator in a first stage in a filter on a low-band side will be described in a fifth preferred embodiment of the present invention.

Configuration of Filter Apparatus

Figure 13:
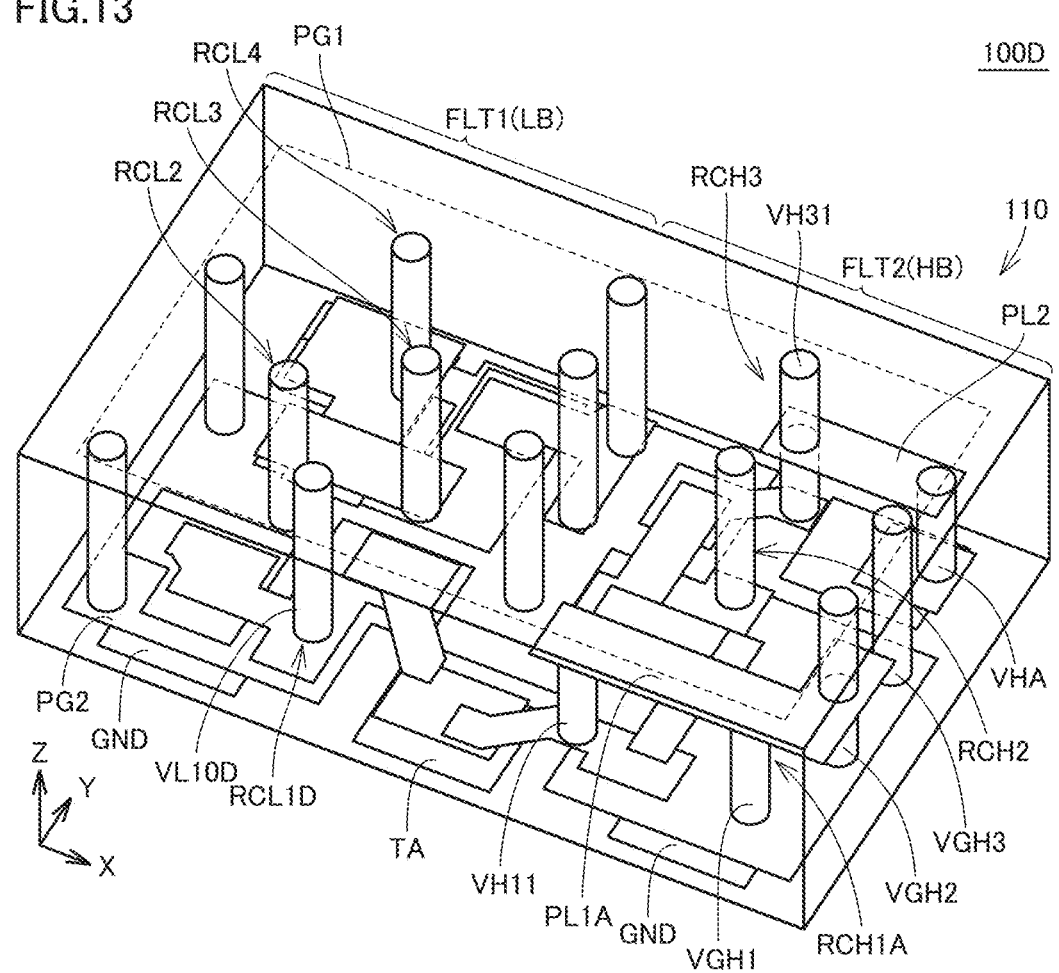
FIG. 13 is a perspective view showing the inside of a filter apparatus according to a fifth preferred embodiment of the present invention.

FIG. 13 is a perspective view showing the inside of a filter apparatus 100D according to a fifth preferred embodiment of the present invention. In FIG. 13, resonator RCL1 of filter FLT1 which is the low-band filter in filter apparatus 100A in the second preferred embodiment shown in FIG. 7 is replaced with a resonator RCL1D. More specifically, in resonator RCL1D, inductor L11 includes a single via VL10D, and capacitor C11 and plate electrode PG1 are connected to each other through via VL10D. Since resonator RCL1D is shorter in length of the inductor than resonator RCL1 in the first preferred embodiment, the inductance value is smaller. Thus, reduction in insertion loss can be expected as compared with the configuration in the second preferred embodiment, although it is not great to such an extent as being clearly shown in a characteristic diagram.

The configuration of filter apparatus 100D in the fifth preferred embodiment other than resonator RCH1D is the same or substantially the same as in filter apparatus 100, and description of the same or corresponding elements as in filter apparatus 100 will not be repeated.

Pass Characteristics

Figure 14:
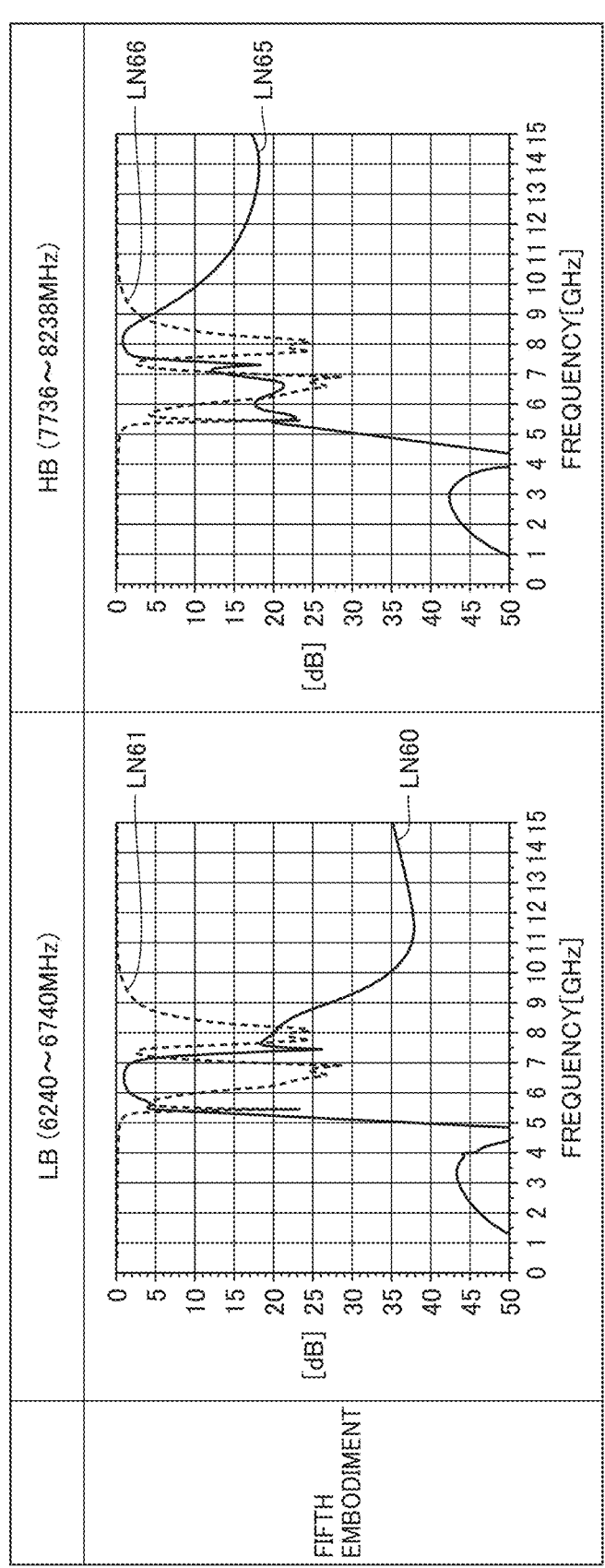
FIG. 14 is a diagram for illustrating pass characteristics of the filter apparatus according to the fifth preferred embodiment of the present invention.

FIG. 14 is a diagram for illustrating pass characteristics of filter apparatus 100D in the fifth preferred embodiment. In FIG. 14, solid lines LN60 and LN65 represent insertion loss and dashed lines LN61 and LN66 represent return loss.

Referring to FIG. 14, in the configuration of filter apparatus 100D as well, as in filter apparatus 100A in the second preferred embodiment, the attenuation amount in the frequency band on the lower frequency side than the passband is larger than in the filter apparatus in the comparative example in FIG. 6. Furthermore, the inductance value of resonator RCL1D is small, although it is not clearly shown in a characteristic diagram in FIG. 14. Therefore, reduction in insertion loss can be expected as compared with filter apparatus 100A in the second preferred embodiment in FIG. 8.

Although an example in which the resonator in the first stage in the high-band filter is resonator RCH1A in the second preferred embodiment is described in the fifth preferred embodiment, the configuration of the high-band filter described in the first, third, or fourth preferred embodiment may be combined depending on a desired filter characteristic.

"Via VL10D" in the fifth preferred embodiment corresponds to the "eighth via" in the present disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter apparatus comprising:
   an input terminal;
   a first ground electrode and a second ground electrode opposed to each other;
   a first filter connected to the input terminal and having a first passband; and
   a second filter connected to the input terminal and having a second passband higher than the first passband; wherein
   each of the first filter and the second filter includes resonators in a plurality of stages between the first ground electrode and the second ground electrode;
   a first resonator in a first stage connected to the input terminal in the first filter includes:
      a first capacitor connected to the second ground electrode; and
      a first inductor connected between the first capacitor and the first ground electrode;
   a second resonator in a first stage connected to the input terminal in the second filter includes:
      a second capacitor connected between the input terminal and the second ground electrode; and
      a second inductor connected between the second capacitor and the second ground electrode; and
   the second inductor includes:
      a first via connected to the second capacitor;
      a second via connected to the second ground electrode; and
      a first line electrode connecting the first via and the second via to each other.

2. The filter apparatus according to claim 1, wherein the first inductor includes an eighth via connecting the first capacitor and the first ground electrode to each other.

3. The filter apparatus according to claim 1, wherein the second inductor further includes a third via connected to the first line electrode, the first ground electrode, and the second ground electrode.

4. The filter apparatus according to claim 3, wherein the second inductor further includes a fourth via connected to the first line electrode, the first ground electrode, and the second ground electrode.

5. The filter apparatus according to claim 1, wherein the second inductor further includes a fifth via connecting the second via and the first ground electrode to each other.

6. The filter apparatus according to claim 1, wherein the first inductor includes:
   a sixth via connected to the first capacitor;
   a seventh via connected to the first ground electrode; and
   a second line electrode connecting the sixth via and the seventh via to each other.

7. A radio-frequency front end circuit comprising the filter apparatus according to claim 1.

8. The radio-frequency front end circuit according to claim 7, wherein
   the first inductor includes:
      a sixth via connected to the first capacitor;
      a seventh via connected to the first ground electrode; and
      a second line electrode connecting the sixth via and the seventh via to each other.

9. The radio-frequency front end circuit according to claim 7, wherein the first inductor includes an eighth via connecting the first capacitor and the first ground electrode to each other.

10. The radio-frequency front end circuit according to claim 7, wherein the second inductor further includes a third via connected to the first line electrode, the first ground electrode, and the second ground electrode.

11. The radio-frequency front end circuit according to claim 10, wherein the second inductor further includes a fourth via connected to the first line electrode, the first ground electrode, and the second ground electrode.

12. The radio-frequency front end circuit according to claim 8, wherein the second inductor further includes a fifth via connecting the second via and the first ground electrode to each other.

13. A communication apparatus comprising the radio-frequency front end circuit according to claim 8.

14. The communication apparatus according to claim 13, wherein the second inductor further includes a third via connected to the first line electrode, the first ground electrode, and the second ground electrode.

15. The communication apparatus according to claim 14, wherein the second inductor further includes a fourth via connected to the first line electrode, the first ground electrode, and the second ground electrode.

16. The communication apparatus according to claim 13, wherein the second inductor further includes a fifth via connecting the second via and the first ground electrode to each other.

17. The communication apparatus according to claim 13, wherein
   the first inductor includes:
      a sixth via connected to the first capacitor;
      a seventh via connected to the first ground electrode; and
      a second line electrode connecting the sixth via and the seventh via to each other.

* * * * *